US010035922B2

(12) United States Patent
Almadhoun et al.

(10) Patent No.: US 10,035,922 B2
(45) Date of Patent: Jul. 31, 2018

(54) PROCESSING OF THIN FILM ORGANIC FERROELECTRIC MATERIALS USING PULSED ELECTROMAGNETIC RADIATION

(71) Applicant: SABIC Global Technologies B.V., Amsterdam (NL)

(72) Inventors: Mahmoud N. Almadhoun, Thuwal (SA); Ihab N. Odeh, Sugar Land, TX (US); Mohd Adnan Khan, Thuwal (SA)

(73) Assignee: SABIC Global Technologies B.V., Bergen op Zoom (NL)

( * ) Notice: Subject to any disclaimer, the term of this patent is extended or adjusted under 35 U.S.C. 154(b) by 0 days.

(21) Appl. No.: 15/315,503

(22) PCT Filed: May 19, 2015

(86) PCT No.: PCT/US2015/031522
§ 371 (c)(1),
(2) Date: Dec. 1, 2016

(87) PCT Pub. No.: WO2015/191254
PCT Pub. Date: Dec. 17, 2015

(65) Prior Publication Data
US 2017/0114241 A1    Apr. 27, 2017

Related U.S. Application Data

(60) Provisional application No. 62/009,729, filed on Jun. 9, 2014, provisional application No. 62/112,203, filed on Feb. 5, 2015.

(51) Int. Cl.
*G11C 11/22*       (2006.01)
*C09D 127/16*   (2006.01)
(Continued)

(52) U.S. Cl.
CPC ............. *C09D 127/16* (2013.01); *C09D 5/24* (2013.01); *G11C 11/221* (2013.01);
(Continued)

(58) Field of Classification Search
CPC ...... C09D 127/16; C09D 5/24; G11C 11/221; G11C 11/2275; G11C 11/2273;
(Continued)

(56) References Cited

U.S. PATENT DOCUMENTS 6,067,244 A    5/2000  Ma et al. ...................... 365/145
8,410,712 B2  4/2013  Schroder et al. .......... 315/241 P
(Continued)

FOREIGN PATENT DOCUMENTS

CA         2738099 A1    10/2011
CN      101540194 A      9/2009
(Continued)

OTHER PUBLICATIONS

International Preliminary Report on Patentability for PCT/US2015/031522, dated Aug. 26, 2016.
(Continued)

*Primary Examiner* — Tha-O H Bui
(74) *Attorney, Agent, or Firm* — Norton Rose Fulbright US LLP

(57) ABSTRACT

Disclosed is a method for producing a polymeric ferroelectric material. The method can include (a) obtaining a polymeric ferroelectric precursor material, and (b) subjecting the polymeric ferroelectric precursor material to pulsed electromagnetic radiation sufficient to form a polymeric ferroelectric material having ferroelectric hysteresis properties, wherein the polymeric ferroelectric precursor material, prior to step (b), has not previously been subjected to a thermal treatment for more than 55 minutes.

20 Claims, 8 Drawing Sheets

(51) Int. Cl.
  *H01G 4/002* (2006.01)
  *H05K 1/03* (2006.01)
  *H01L 41/04* (2006.01)
  *H01L 27/11507* (2017.01)
  *H01L 27/1159* (2017.01)
  *C09D 5/24* (2006.01)

(52) U.S. Cl.
  CPC ...... *G11C 11/2273* (2013.01); *G11C 11/2275* (2013.01); *H01G 4/002* (2013.01); *H01L 27/1159* (2013.01); *H01L 27/11507* (2013.01); *H01L 41/042* (2013.01); *H05K 1/03* (2013.01)

(58) Field of Classification Search
  CPC ............ H01L 27/11507; H01L 41/042; H01L 27/1159; H05K 1/03; H01G 4/002
  USPC ........................................................ 365/145
  See application file for complete search history.

(56) References Cited

U.S. PATENT DOCUMENTS

| | | | |
|---|---|---|---|
| 2003/0056078 A1 | 3/2003 | Johansson et al. | 711/200 |
| 2003/0188251 A1* | 10/2003 | Brown | G06F 11/1068 714/763 |
| 2005/0213280 A1* | 9/2005 | Azrai | H01L 23/50 361/271 |
| 2005/0224849 A1* | 10/2005 | Isenberger | G11C 11/22 257/295 |
| 2006/0160251 A1* | 7/2006 | Dyreklev | G11C 11/22 438/3 |
| 2009/0039341 A1 | 2/2009 | Marsman et al. | 257/40 |
| 2009/0236908 A1* | 9/2009 | Park | G11C 7/02 307/19 |
| 2009/0263671 A1 | 10/2009 | Yao et al. | 428/457 |
| 2009/0294818 A1 | 12/2009 | Ishida et al. | 257/295 |
| 2010/0148232 A1 | 6/2010 | Ng et al. | 257/295 |
| 2011/0260283 A1 | 10/2011 | Wu et al. | 257/506 |
| 2012/0313482 A1 | 12/2012 | Yao et al. | 310/331 |

FOREIGN PATENT DOCUMENTS

| | | |
|---|---|---|
| JP | 2002314045 A | 10/2002 |
| KR | 20060120220 | 11/2006 |
| KR | 20070087022 A | 8/2007 |
| KR | 2009131313 A | 12/2009 |

OTHER PUBLICATIONS

International Search Report and Written Opinion for PCT/US2015/031522, dated Sep. 22, 2015.
Li et al., *Applied Physics Letters* 103, 072903 (2013).
Li et al., *J. Mater Chem. C* 1, 7695-7702 (2013).
Li et al., *Nature Materials* 12, 433-438 (2013).
Extended European Search Report and Opinion for EP15806362.8, dated Apr. 4, 2017.

* cited by examiner

PROCESSING OF THIN FILM ORGANIC FERROELECTRIC MATERIALS USING PULSED ELECTROMAGNETIC RADIATION

CROSS REFERENCE TO RELATED APPLICATIONS

This application is a national phase application under 35 U.S.C. § 371 of International Application No. PCT/US2015/031522 filed May 19, 2015, which claims the benefit of U.S. Provisional Application No. 62/009,729 titled "PROCESSING OF THIN FILM ORGANIC FERROELECTRIC MATERIALS USING PULSED ELECTROMAGNETIC RADIATION", filed Jun. 9, 2014 and U.S. Provisional Application No. 62/112,203 titled "PROCESSING OF THIN FILM ORGANIC FERROELECTRIC MATERIALS USING PULSED ELECTROMAGNETIC RADIATION", filed Feb. 5, 2015. The entire contents of the above-referenced patent applications are incorporated into the present application by reference without disclaimer.

BACKGROUND OF THE INVENTION

A. Field of the Invention

The present disclosure generally relates to processing of polymeric ferroelectric materials that can be used in non-volatile memory and energy storage applications. The process includes using pulsed electromagnetic radiation techniques to convert polymeric ferroelectric precursor materials to ferroelectric materials having ferroelectric hysteresis properties. Traditional thermal treatment of the ferroelectric precursor material can be minimized and even avoided with the process of the present invention. Further, the process allows for the implementation of low cost roll-to-roll (R2R) techniques to make the polymeric ferroelectric materials of the present invention.

B. Description of Related Art

Memory systems are used for storage of data, program code, and/or other information in many electronic products, such as personal computer systems, embedded processor-based systems, video image processing circuits, portable phones, and the like. Important characteristics for a memory cell in electronic device are low cost, nonvolatility, high density, writability, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM and EEPROM are all non-volatile, meaning that if power to the memory is interrupted the memory will retain the information stored in the memory cells.

DRAM stores charge on transistor gates that act as capacitors but must be electrically refreshed every few milliseconds complicating system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

Consequently, existing technologies are either non-volatile but are not randomly accessible and have low density, high cost, and limited ability to allow multiples writes with high reliability of the circuit's function, or they are volatile and complicate system design or have low density. Some technologies have attempted to address these shortcomings including ferromagnetic RAM (FRAM) which utilize a ferromagnetic region of a ferroelectric capacitor or thin film transistor to generate a nonvolatile memory cell.

These capacitors and thin film transistors are fabricated using two parallel conductive plates separated by a ferroelectric polymer layer. The ferroelectric polymer layer is essentially a thin layer of insulating film which contains a permanent electrical polarization that can be reversed repeatedly, by an opposing electric field. As a result, the ferroelectric capacitor or thin film transistor has two possible non-volatile states, which they can retain without electrical power, corresponding to the two binary logic levels in a digital memory. Ferroelectric capacitors and thin film transistors frequently use a polyvinylidene fluoride (PVDF-TrFE) copolymer as the ferroelectric material due to its large polarization value and electrical and material properties.

Ferroelectric capacitors and transistors also provide energy-storing functionality. When a voltage is applied across the plates, the electric field in the ferroelectric material displaces electric charges, and thus stores energy. The amount of energy stored depends on the dielectric constant of the insulating material and the dimensions (total area and thickness) of the film, such that in order to maximize the total amount of energy that a capacitor or transistor can accumulate, the dielectric constant and breakdown voltage of the film are maximized, and the thickness of the film minimized.

While ferroelectric capacitors and thin film transistor devices address many of the important characteristics for a memory cell and energy storage, they can be expensive, time-consuming, and complicated to make. For instance, processing of a given ferroelectric material typically begins with a ferroelectric precursor material that is solubilized within a solution, gel, semi-dry form, or melt. This precursor material is subjected to an annealing step (i.e., heat treatment with a heat source such as heating plates or ovens) to remove solvent and to form a crystalline phase, thus forming the ferroelectric material.

This annealing step is a rate-limiting step in producing ferroelectric materials. By way of example, PVDF-based polymers are annealed at a temperature range of 80° C. to about 170° C. for a plurality of minutes up to about 30 minutes to form the desired crystalline phase. Therefore, the use of efficient processing systems such as roll-to-roll processing are not a viable option for making ferroelectric materials. Incorporation of the current annealing steps used to make ferroelectric materials into a roll-to-roll system not only slows down the process, but also contributes significantly to the overall thermal budget of the manufacturing line.

SUMMARY OF THE INVENTION

A solution to the current problems associated with making polymeric ferroelectric materials has been identified. The solution resides in an annealing step that can be performed in microseconds to seconds rather than minutes, thereby opening up the possibility of using more efficient systems (e.g., roll-to-roll process or system) to make ferroelectric devices such as ferroelectric capacitors and thin film transistors. In particular, the solution resides in using pulsed electromagnetic radiation as the annealing step, which can be done in microseconds to seconds. Without wishing to be bound by theory, it is believed that the pulsed electromagnetic radiation creates an environment that enables the conversion of polymeric ferroelectric precursor material into polymeric ferroelectric material having ferroelectric hysteresis properties by promoting crystallization of the precursor material via removal of solvents, sintering, curing, and/or drying of said precursor material. Notably, conventional thermal treatment steps (i.e., heating precursor material with an external heat source (e.g., hot plate, oven, furnace, heat lamp, etc.)) can be minimized or avoided all together. Further, no additives such as curing agents, cross-linking agents, or electromagnetic absorbing agents need to be incorporated into the precursor material. Stated plainly, polymeric ferroelectric precursor material (e.g., ferroelectric organic polymers, e.g., PVDF—based polymers—solubilized within a solvent or composition) can be directly converted into polymeric ferroelectric material having ferroelectric hysteresis properties within microseconds without the use of traditional thermal treatment steps and without the use of additives. The processes of the present invention can be used to decrease the overall costs, complexity, and time to make ferroelectric devices such as capacitors and thin film transistors.

In one aspect of the present invention there is disclosed a method for producing a ferroelectric material, the method can include (a) obtaining a ferroelectric precursor material, and (b) subjecting the ferroelectric precursor material to pulsed electromagnetic radiation sufficient to form a ferroelectric material having ferroelectric hysteresis properties. In certain aspects, the ferroelectric precursor material, prior to step (b), has not previously been subjected to a thermal treatment step (i.e., heating precursor material with an external heat source (e.g., hot plate, ovens, furnaces, or heat lamp, etc.)) for more than 55 minutes, 50, minutes, 40 minutes, 30 minutes, 20 minutes, 10 minutes, 5 minutes, 3 minutes, 2 minutes, 1 minute or has not been previously subjected to a thermal treatment step (i.e., 0 minutes). In preferred aspects, the ferroelectric precursor material, prior to step (b), has not been subjected to a thermal treatment step for more than 30 minutes, or preferably for more than 10 minutes or 5 minutes, or preferably has not been subjected to said thermal treatment. Further, and in certain instances, no additives such as curing agents, cross-linking agents, or electromagnetic absorbing agents, or any combination thereof or all thereof are added to the precursor material. Still further, the ferroelectric precursor material, in certain embodiments, is not cast under inert conditions—rather it can be placed onto a substrate under normal atmospheric conditions and then subjected to step (b) to form the ferroelectric material. That is to say, the ferroelectric precursor material can be directly processed to a ferroelectric material having ferroelectric hysteresis properties without the use of any previous heat treatment/annealing steps or without the use of any additives or both. Notably, step (b) can be performed in as short a time frame as 0.000001 seconds to less than 60 seconds, less than 30 seconds, less than 15 seconds, less than 1 second, less, than 0.5 seconds, less than 0.1 seconds, less than 0.01 seconds, less than 0.001 seconds, less than 0.0001 seconds, to less than 0.00001 seconds. That is, the time it takes to convert the precursor material into ferroelectric material having ferroelectric hysteresis properties via the pulsed electromagnetic radiation can occur within 0.000001 seconds to less than 60 seconds. In certain aspects, this time frame can be 25 µs to up to 60 seconds. However, time frames of greater than 60 seconds can be used (e.g., 75 seconds, 90 seconds, 105 seconds, 2 minutes, 3 minutes, 4 minutes, 5 minutes, 6 minutes, 7 minutes, 8 minutes, 9 minutes, 10 minutes, or more). The time frame for performing both steps (a) and (b) can be limited by the printing rate of the printing technique used to deposit the precursor in step (a) (e.g., spray coating, ultra sonic spray coating, roll-to-roll coating, ink jet printing, screen printing, drop casting, spin coating, dip coating, Mayer rod coating, gravure coating, slot die coating, doctor blade coating, extrusion coating, flexography, gravure, offset, rotary screen, flat screen, ink-jet, roll-to-roll photolithography, or laser ablation). In certain aspects, the time frame can be 0.01 $m^2/s$ to 100 $m^2/s$ or any time or range therein (e.g., 0.01 $m^2/s$ to 90, 80, 70, 60, 50, 40, 30, 20, 10, 5, 1, 0.5, 0.1, 0.05 $m^2/s$). In certain aspect, the time range can be less than 100 $m^2/s$, less than 75 $m^2/s$, less than 50 $m^2/s$, less than $m^2/s$, less than 25 $m^2/s$, less than 10 $m^2/s$, less than 5 $m^2/s$, or less than 1 $m^2/s$, or less. The pulsed electromagnetic radiation in certain preferred aspects has a wavelength of 200 nm to 1500 nm, or more preferable from 200 nm to 1000 nm. However, wavelengths below 200 nm (e.g., y-rays, x-rays, extreme ultraviolet light) and above 1500 nm (e.g., microwaves, and radio waves) can also be used. Still further, the electromagnetic radiation used in step (b) can be focused on a particular wavelength (e.g., 300 nm) or a particular radiation type (e.g., gamma rays, x-rays, ultraviolet light, visible light, infrared light, microwaves, radio waves) at the exclusion of types of radiation (e.g., visible light is used as the pulsed light and does not include UV light or IR light). In certain instances, a broad range of radiation can be used in which the pulsed electromagnetic radiation includes all wavelengths within a given range (e.g., 200 nm to 1500 nm or 200 nm to 1000 nm). Still further, and in some non-limiting aspects, UV radiation (e.g., about 100 nm to about 400 nm) is not used in the pulsed light. In some aspects, the pulse length (i.e., the period of time that the pulsed electromagnetic radiation is turned on to the time it is turned off for each pulse) is about 25 µs to 10,000 µs or any integer or range therein (e.g., 50, 100, 150, 200, 250, 300, 350, 400, 450, 500, 550, 600, 650, 700, 750, 800, 850, 900, 950, 1000, 1500, 2000, 2500, 3000, 3500, 4000, 4500, 5000, 5500, 6000, 6500, 7000, 7500, 8000, 8500, 9000, 9500, to 10000 µs). The pulse length, in certain aspects, can be longer than 10000 micro seconds as well (e.g., the range can be 25 µs to 1 second. In certain particular aspects, the pulse length can be very short, such as under 100 µs (e.g., about 5 to 15 µs, or about 10 µs, about 40 to 60 µs, or about 50 µs, or about 80 to 120 µs, or 100 µs). In particularly preferred embodiments, the pulse length can be short (e.g., 50 to 250 µs, or preferably about 200 µs), medium (e.g., about 300 to 500 µs, or preferably about 400 µs), or long (e.g., about 600 to 900 µs, or preferably about 800 µs). The pulses can be a single pulse or multiple pulses up 1000 pulses or any integer or range therein (e.g., 1, 10, 20, 30, 40, 50, 60, 70, 80, 90, 100, 150, 200, 250, 300, 350, 400, 450, 500, 550, 600, 650, 700, 750, 800, 850, 900, or 1000). The pulse rate that can be used in the context of the present invention can be about 0.10 Hz to 1 kHz or any integer or range therein (e.g., 0.1, 1, 10, 20, 30, 40, 50, 60, 70, 80, 90, 100, 150, 200, 250, 300, 350, 400, 450, 500, 550, 600, 650, 700, 750, 800, 850, 900, or 1000 Hz, or more). The radiant energy of the pulsed electromagnetic radiation can range from 1 to 100 J/cm² or any radiant energy or range therein (e.g., 1, 2, 3, 4, 5, 6, 7, 8, 9, 10, 20, 30, 40, 50, 60, 70, 80 90, 100 J/cm²-greater radiant energy can also be used if desired). The temperature of the pulsed electromagnetic radiation can be 20° C. to 1300° C. or any temperature or range therein (e.g., 30, 40, 50, 60, 70, 80, 90, 100, 150, 200, 250, 300, 350, 400, 450, 500, 550, 600, 650, 700, 750, 800, 850, 900, 950, 1000, 1200, or 1300° C.—greater temperatures can also be used if desired). Notably, these temperatures (and pulse length) are sufficient to convert the precursor material into ferroelectric material having hysteresis properties without damaging the underlying substrate, thereby allowing for the use of substrates having low glass transition temperatures ($T_g$) (e.g., polyethylene terephthalate (PET), polyethylene (PE), polyvinyl chloride (PVC), polystyrene (PS), or polypropylene (PP), or copolymers, terpolymers, or blends thereof). Without wishing to be bound by theory, it is believed that the combination of the pulse length and temperature allows for a fast conversion of the precursor material into the ferroelectric material without raising the temperature of the underlying substrate significantly, such as above its $T_g$ temperature. For instance, the depth of the pulsed electromagnetic radiation can remain within the precursor material/not penetrate the underlying substrate, thereby preserving the substrate. Alternatively, the depth of the pulsed electromagnetic radiation can penetrate the entire precursor material and not penetrate or only partially penetrate the upper surface of the substrate. In certain aspects, the pulsed electromagnetic radiation has a pulse depth of 10 nm to up to 1000 nm, or more preferably, 100 to 300 nm, or even more preferably, a depth that penetrates the precursor material but not the substrate or only partially penetrates the substrate (e.g., up to 10, 20, 30, 40, 50, 60, 70, 80, 90, or 100 nm). In certain aspects, the glass transition temperature of the underlying substrate can range from 10° C. to 300° C. or any number or range therein (e.g., 10° C. to 250° C., 10° C. to 200° C., 10° C. to 150° C., 10° C. to 100° C., 10° C. to 50° C., or 50° C. to 300° C., 100° C. to 300° C., 150° C. to 300° C., 200° C. to 300° C., or 250° C. to 300° C.). In certain preferred aspects, a crystalline phase is formed in the ferroelectric precursor material in step (b). Such a crystalline phase may not be present in step (a). Also, the ferroelectric precursor material in step (a), in certain instances of the present invention, does not exhibit ferroelectric hysteresis properties. Thus, the pulsed electromagnetic radiation allows for the formation of such ferroelectric hysteresis properties in a short time period and without any need or reliance on conventional thermal treatment steps, which opens up the process of the present invention to more efficient processing systems such as roll-to-roll systems (e.g., steps (a) and (b) can be part of a roll-to-roll process). In one instance, step (a) further includes disposing the ferroelectric precursor material onto a substrate such that the ferroelectric precursor material has a first surface and an opposing second surface, wherein the second surface is in contact with the substrate surface. The ferroelectric precursor material can be disposed onto the substrate in a liquid form, a gel form, a semi-dry form, or a melt form. In particular instances, the disposed precursor material forms a thin film over the substrate (e.g., a film having a thickness of 10 nm to 1000 nm, or more preferably, 50 nm to 500 nm, or still more preferably from 100 to 300 nm). In certain aspects, the substrate can further include an electrode, and wherein at least a portion of the second surface of the ferroelectric precursor material is in contact with the electrode. A further step (c) can be incorporated into the process, such that after step (b), a top electrode can be disposed onto at least a portion of the ferroelectric material having ferroelectric hysteresis properties. Notably, the ferroelectric precursor material can be disposed on the substrate or the electrode by spray coating, ultra sonic spray coating, roll-to-roll coating, ink jet printing, screen printing, drop casting, spin coating, dip coating, Mayer rod coating, gravure coating, slot die coating, doctor blade coating, extrusion coating, flexography, gravure, offset, rotary screen, flat screen, ink-jet, roll-to-roll photolithography, or laser ablation. Also, the bottom or top electrodes, or both, can be disposed on the at least a portion of the first surface of the ferroelectric material having ferroelectric hysteresis properties by spray coating, ultra sonic spray coating, roll-to-roll coating, ink jet printing, screen printing, drop casting, spin coating, dip coating, Mayer rod coating, gravure coating, slot die coating, doctor blade coating, extrusion coating, flexography, gravure, offset, rotary screen, flat screen, ink-jet, roll-to-roll photolithography, or laser ablation. In certain instances, the ferroelectric precursor material is not in crystalline or semi-crystalline form prior to performing step (b) and the pulsed electromagnetic radiation is used to form the crystalline or semi-crystalline phase. Additionally, the ferroelectric precursor material can be solubilized in a solvent prior to performing step (b), and wherein the solvent is substantially removed or completely removed in step (b) to produce the ferroelectric material having ferroelectric hysteresis properties. Non-limiting examples of solvents include methyl ethyl ketone, dimethylformamide, acetone, dimethyl sulfoxide, cyclohexanone, tetrahydrofuran, or combinations thereof. The produced ferroelectric material having ferroelectric hysteresis properties can be in the form of a film. The thickness of the film can be 1 nm to 10,000 nm, or more or any range therein (e.g., 10 nm to 10,000 nm, or 100 to 5,000 nm, 200 to 1,000 nm, etc.). In certain instances, the thickness can be more than 1 micron, 2, microns, 3, microns, 4, microns, 5 microns, 6 microns, 7 microns, 8 microns, 9 microns, 10 microns, or more (e.g., 20, 30, 40, 50 microns or more). The ferroelectric precursor material in step (a) can be a polymeric material (i.e., it includes a polymer or a blend of polymers). In certain aspects, the majority of the ferroelectric precursor material can include a polymer. In preferred embodiments, the polymeric ferroelectric precursor material can be organic polymeric ferroelectric precursor material. In one aspect, the polymeric ferroelectric precursor material includes a single type of polymer (e.g., ferroelectric polymer). In other instances, the polymeric ferroelectric precursor material can include a polymeric blend. The polymeric blend can include an organic ferroelectric polymer and an organic non-ferroelectric polymer. In more particular instances, the ferroelectric polymer can be a polymer, copolymer, terpolymer, or a polymer blend that includes a ferroelectric polymer, copolymer, or terpolymer or combinations thereof. In particular instances, the polymer or polymers in a blend are organic polymers. Non-limiting examples of ferroelectric polymers include polyvinylidene fluoride (PVDF)-based polymers, polyundecanoamide (Nylon 11)-based polymers, or blends of PVDF-based polymers or polyundecanoamide (Nylon 11)-based polymers. The PVDF-based polymer can be a homopolymer, a copolymer, or a terpolymer, or a blend thereof. A non-limiting example of a PVDF-based homopolymer polymer is PVDF. Non-limiting examples of PVDF-based copolymers are poly(vinylidene fluoride-tetrafluoro ethylene) (P(VDF-TrFE)), poly(vinylidene-fluoride-co-hexafluoropropene) (P(VDF-HFP)), poly(vinylidene-fluoride-chlorotrifluoroethylene) (P(VDF-CTFE)) or poly(vinylidene-fluoride-chlorofluoroethylene) (P(VDF-CFE)). Non-limiting examples of PVDF-based terpolymers include poly(vinylidene-fluoride-trifluoroethylene-chlorotrifluoroethylene) (P(VDF-TrFE-CTFE)) or poly(vinylidene-fluoride-trifluoroethylene-chlorofluoroethylene) (P(VDF-TrFE-CFE)). The ferroelectric polymer can be blended with a non-ferroelectric polymer. Examples of non-ferroelectric polymers include a poly(phenylene oxide) (PPO), a polystyrene (PS), or a poly(methyl methacrylate) (PMMA), or blends thereof. In other instances, the polymeric ferroelectric precursor material can include a ferroelectric polymer and an inorganic material or filler. Non-limiting examples of inorganic materials and fillers include lead zirconium titanate, barium titanate, barium strontium titanate, or molybdenum disulfide or combinations thereof. In other instances, however, the ferroelectric precursor material does not include inorganic materials or fillers. In one particular instance, the ferroelectric precursor material does not include lead zirconium titanate. In even more particular instances, the ferroelectric precursor material does not include lead zirconium titanate, barium titanate, barium strontium titanate, and molybdenum disulfide. In additional embodiments, the polymeric ferroelectric precursor material can be subjected to electric field. The electric field can be from electrophoresis. The polymeric ferroelectric precursor material can be subjected to pulsed electromagnetic radiation prior to or simultaneously with the electric field. In other aspects, the polymeric ferroelectric precursor material can be subjected to the electric field prior to or simultaneously with the pulsed electromagnetic radiation. In preferred instances, steps (a) and (b) are performed in a roll-to-roll process. The roll-to-roll process can include (i) obtaining a substrate uncoiled from a roll; (ii) disposing a back electrode onto at least a portion of a surface of the substrate; (iii) disposing the ferroelectric precursor material onto at least a portion of a surface of the back electrode such that ferroelectric precursor material can include a first surface and an opposing second surface that is in contact with the back electrode; (iv) subjecting at least a portion of the first surface to pulsed electromagnetic radiation sufficient to form the ferroelectric material having ferroelectric hysteresis properties, wherein the ferroelectric precursor material, prior to step (iv), has not previously been subjected to a thermal treatment step for more than 55 minutes, 50 minutes, 40 minutes, 30 minutes, 20 minutes, 10 minutes, 5 minutes, 3, minutes, 2 minutes, 1 minute or has not previously been subjected to a thermal treatment step at all (i.e., 0 minutes); and (v) disposing a front electrode onto at least a portion of the first surface of the ferroelectric material having ferroelectric hysteresis properties. No curing agents or additives are needed in the roll-to-roll process.

In another aspect of the present invention there is disclosed a ferroelectric capacitor or ferroelectric thin film transistor that can include the ferroelectric material of the present invention. The ferroelectric capacitor or thin film transistor can include a first conductive material, and a second conductive material, wherein at least a portion of the ferroelectric material is disposed between at least a portion of the first conductive material and at least a portion of the second conductive material. The first and/or second conductive material can include a metal such as platinum, gold, aluminum, silver, or copper, or a metal oxide such as zinc oxide or alloys thereof. In some aspects, the first and/or second conductive material can include PEDOT:PSS, polyaniline, or graphene. In other embodiments, the first and/or second conductive material can include a metal-like conductive substrate such as indium-doped Tin Oxide (ITO). The ferroelectric capacitor or thin film transistor can be included on a substrate. The substrate can be silicon, plastic, paper, cloth, etc. In particular aspects, the substrate can be a banknote (e.g., a bill, paper money, or simply a note or promissory note).

In still another embodiment there is disclosed a printed circuit board or an integrated circuit that can include the ferroelectric material or the ferroelectric capacitor or the ferroelectric thin film transistor of the present invention. The ferroelectric material, capacitor, or thin film transistor in the printed circuit board or integrated circuit can be included in at least a portion of a communications circuit, a sensing circuit, or a control circuit. The circuit can be a piezoelectric sensor, piezoelectric transducer, piezoelectric actuator, or a pyroelectric sensor. Further, electronic devices can include the ferroelectric material or the ferroelectric capacitor or thin film transistors of the present invention are also contemplated.

Also disclosed is an integrated circuit or an electronic device that can include the ferroelectric material produced by the processes of the present invention, or a ferroelectric capacitor or thin film transistor of the present invention. The integrated circuit can be included in at least a portion of a communications circuit, a sensing circuit, or a control circuit.

Another aspect of the present invention includes a method for reading and restoring data to a nonvolatile memory cell that can include a ferroelectric capacitor or thin film transistor of the present invention. The method can include: (1) applying a voltage to the ferroelectric capacitor or thin film transistor; (2) increasing the voltage by a predetermined amount; (3) detecting a charge signal that results from increasing said voltage, wherein a charge signal having at least a certain minimum amplitude indicates a change in a previously set polarization state representing a first binary logic level; and (4) restoring said previously set polarization state in said ferroelectric capacitor or thin film transistor if the polarization state has been changed, by altering a polarity of the voltage applied to said ferroelectric capacitor or thin film transistor.

In another aspect of the present invention there is also disclosed a method for writing to a nonvolatile memory cell that can include a ferroelectric capacitor or thin film transistor of the present invention. Such a method can include: (1) applying a voltage to the ferroelectric capacitor or thin film transistor; (2) increasing said voltage by a predetermined amount; (3) detecting a charge signal that results from increasing the voltage, wherein a charge signal having at least a certain minimum amplitude indicates a change to a second polarization state representing a second binary logic level; (4) maintaining said second polarization state if said memory cell represents said second binary logic level; and (5) restoring to a first polarization state representing a first binary logic level if memory cell represents a first binary logic level, by altering a polarity the voltage applied to said ferroelectric capacitor or thin film transistor.

In a further embodiment of the present invention there is disclosed a method of decoupling a circuit from a power supply with a ferroelectric capacitor or thin film transistor of the present invention. The method can include disposing the ferroelectric capacitor or thin film transistor between a power voltage line and a ground voltage line, wherein the ferroelectric capacitor or thin film transistor is coupled to the power voltage line and to the ground voltage line, and wherein a reduction in power noise generated by the power voltage and the ground voltage is achieved.

Also disclosed is a method for operating an energy storage circuit that can include a ferroelectric capacitor or thin film transistor of the present invention, which provides electrical power to a consuming device when electrical power from a primary source is unavailable. The method can include: (1) defining a target energy level for the ferroelectric capacitor or thin film transistor; (2) charging the ferroelectric capacitor or thin film transistor; (3) measuring a first amount of energy that is stored in the ferroelectric capacitor or thin film transistor during charging; (4) terminating charging of the ferroelectric capacitor or thin film transistor when the first amount of energy stored in the capacitor or thin film transistor reaches the target energy level; and (5) discharging the capacitor or thin film transistor into the consuming device when electrical power from the primary source becomes unavailable.

In another embodiment, there is disclosed a method for operating a piezoelectric sensor, a piezoelectric transducer, or a piezoelectric actuator using any one of the ferroelectric capacitors or thin film transistors of the present invention.

Also disclosed in the context of the present invention are embodiments 1 to 55. In a first embodiment, method for producing a polymeric ferroelectric material is described. The method can include (a) obtaining a polymeric ferroelectric precursor material; and (b) subjecting the polymeric ferroelectric precursor material to pulsed electromagnetic radiation sufficient to form a polymeric ferroelectric material having ferroelectric hysteresis properties, wherein the polymeric ferroelectric precursor material, prior to step (b), has not previously been subjected to a thermal treatment for more than 55 minutes. Embodiment 2 is the method of embodiment 1, wherein the pulsed electromagnetic radiation can include a wavelength of 200 nm to 1500 nm. Embodiment 3 is the method of any one of embodiments 1 to 2, wherein the pulse length is 25 μs to 10,000 μs. Embodiment 4 is the method of any one of embodiments 1 to 3, wherein the pulse rate is 0.1 Hz to 1 kHz. Embodiment 5 is the method of any one of embodiments 1 to 4, wherein the polymeric ferroelectric precursor material in step (b) is subjected to 1 up to 1000 pulses. Embodiment 6 is the method any one of embodiments 1 to 5, wherein the radiant energy of the pulsed electromagnetic radiation ranges from 1 to 100 J/cm$^2$. Embodiment 7 is the method of any one of embodiments 1 to 6, wherein a crystalline phase is formed in the polymeric ferroelectric precursor material in step (b). Embodiment 8 is the method of any one of embodiment 1 to 7, wherein the polymeric ferroelectric precursor material in step (a) does not exhibit ferroelectric hysteresis properties. Embodiment 9 is the method of any one of embodiments 1 to 8, wherein step (a) further includes disposing the polymeric ferroelectric precursor material onto a substrate such that the polymeric ferroelectric precursor material has a first surface and an opposing second surface, wherein the second surface is in contact with the substrate surface. Embodiment 10 is the method 9, wherein the substrate further includes an electrode, and wherein at least a portion of the second surface of the polymeric ferroelectric precursor material is in contact with the electrode. Embodiment 11 is the method of any one of embodiments 9 to 11, further includes disposing a top electrode onto at least a portion of the first surface of the polymeric ferroelectric material having ferroelectric hysteresis properties. Embodiment 12, is the method of any one of embodiments 9 to 11, wherein the polymeric ferroelectric precursor material is disposed on the substrate or the electrode by spray coating, ultrasonic spray coating, roll-to-roll coating, ink jet printing, screen printing, drop casting, spin coating, dip coating, Mayer rod coating, gravure coating, slot die coating, doctor blade coating, extrusion coating, flexography, gravure, offset, rotary screen, flat screen, inkjet, or laser ablation. Embodiment 13 is the method of any one of embodiments 11 to 12, wherein the top electrode is disposed on the at least a portion of the first surface of the polymeric ferroelectric material having ferroelectric hysteresis properties by spray coating, ultrasonic spray coating, roll-to-roll coating, ink jet printing, screen printing, drop casting, spin coating, dip coating, Mayer rod coating, gravure coating, slot die coating, doctor blade coating or extrusion coating. Embodiment 14 is the method of any one of embodiments 9 to 13, wherein steps (a) and (b) are performed in less than 100 m$^2$/s. Embodiment 15 is the method of any one of embodiments 1 to 14, wherein the polymeric ferroelectric precursor material in step (a) is in a liquid form, a semi-dry form, a gel form, or a melt form. Embodiment 16 is the method of any one of embodiments 1 to 15, wherein the polymeric ferroelectric precursor material is not in crystalline or semi-crystalline form prior to performing step (b), and wherein the produced polymeric ferroelectric material having ferroelectric hysteresis properties is in crystalline or semi-crystalline form after performing step (b). Embodiment 17 is the method of any one of embodiments 1 to 16, wherein the polymeric ferroelectric precursor material is solubilized in a solvent prior to performing step (b), and wherein the solvent is substantially removed in step (b) to produce the polymeric ferroelectric material having ferroelectric hysteresis properties. Embodiment 18 is the method of any one of embodiments 1 to 17, wherein the produced polymeric ferroelectric material having ferroelectric hysteresis properties is a film. Embodiment 19 is the method of embodiment 18, wherein the thickness of the film is 10 nanometers to 10 microns. Embodiment 20 is the method of any one of embodiments 1 to 19, wherein the polymeric ferroelectric precursor material in step (a) can include a ferroelectric polymer. Embodiment 21 is the method of embodiment 20, wherein the ferroelectric polymer is a polyvinylidene fluoride (PVDF)-based polymer or a blend can include a PVDF-based polymer. Embodiment 22 is the method of embodiment 21, wherein the PVDF-based polymer is a homopolymer, a copolymer, or a terpolymer, or a blend thereof. Embodiment 23 is the method of any one of embodiments 21 to 22, wherein the PVDF-based polymer is blended with a non-PVDF-based polymer. Embodiment 24 is the method of embodiment 23, wherein the non-PVDF polymer is a poly(phenylene oxide) (PPO), a polystyrene (PS), or a poly(methyl methacrylate) (PMMA), or a blend thereof. Embodiment 25 is the method of any one of embodiments 21 to 24, wherein the PVDF-based polymer is PVDF, a poly(vinylidene fluoride-tetrafluoroethylene) (P(VDF-TrFE)), or a poly(vinylidene-fluoride-co-hexafluoropropene) (P(VDF-HFP)), poly(vinylidene fluoride-co-chlorotrifluoroethylene) (PVDF-CTFE), poly(vinylidene fluoride-co-chlorofluoroethylene) (PVDF-CFE), poly(vinylidene fluoride-co-chlorodifluoroethylene) (PVDF-CDFE), poly(vinylidene fluoride-co-trifluoroethylene-co-chlorofluoroethylene) (PVDF-TrFE-CFE), poly(vinylidene fluoride-co-trifluoroethylene-co-chlorotrifluoroethylene) (PVDF-TrFE-CTFE), poly(vinylidene fluoride-co-trifluoroethylene-co-hexafluoropropylene) (PVDF-TrFE-HFP), poly (vinylidene fluoride-co-trifluoroethylene-co-chlorodifluoroethylene) (PVDF-TrFE-CDFE), poly(vinylidene fluoride-co-tetrafluoroethylene-co-chlorofluoroethylene) (PVDF-TFE-CFE), poly(vinylidene fluoride-co-tetrafluoroethylene-co-chlorotrifluoro ethylene) (PVDF-TFE-CTFE), poly (vinylidene fluoride-co-tetrafluoroethylene-co-hexafluoropropylene) (PVDF-TFE-HFP), and poly (vinylidene fluoride-co-tetrafluoroethylene-co-chlorodifluoroethylene) (PVDF-TFE-CD FE), or a polymeric blend thereof. Embodiment 26 is the method of any one of embodiments 1 to 25, wherein steps (a) and (b) are performed in a roll-to-roll process. Embodiment is the method of embodiment 26, further includes: (i) obtaining a substrate uncoiled from a roll; (ii) disposing a back electrode onto at least a portion of a surface of the substrate; (iii) disposing the polymeric ferroelectric precursor material onto at least a portion of a surface of the back electrode such that ferroelectric precursor material can include a first surface and an opposing second surface that is in contact with the back electrode; (iv) subjecting at least a portion of the first surface to pulsed electromagnetic radiation sufficient to form the polymeric ferroelectric material having ferroelectric hysteresis properties, wherein the polymeric ferroelectric precursor material, prior to step (iv), has not previously been subjected to a thermal treatment for more than 55 minutes, more than 30 minutes, more than 5 minutes, or has not previously been subjected to a thermal treatment; and (v) disposing a front electrode onto at least a portion of the first surface of the ferroelectric material having ferroelectric hysteresis properties. Embodiment 28 is the method of any one of embodiments 1 to 27, wherein no curing agent is used or contained in the polymeric ferroelectric precursor material in step (a). Embodiment 29 is the method of any one of embodiments 1 to 28, wherein the polymeric ferroelectric precursor material, prior to step (b), has not previously been subjected to a thermal treatment for more than 30 minutes. Embodiment 30 is the method of any one of embodiments 1 to 28, wherein the polymeric ferroelectric precursor material, prior to step (b), has not been subjected to a thermal treatment for more than 5 minutes. Embodiment 31 is the method of any one of embodiments 1 to 28, wherein the polymeric ferroelectric precursor material, prior to step (b), has not been subjected to a thermal treatment. Embodiment 32 is the method of any one of embodiments 1 to 31, wherein the polymeric ferroelectric precursor material is a polymeric blend. Embodiment 33 is the method of embodiment 32, wherein the polymeric blend can include a ferroelectric polymer and a non-ferroelectric polymer. Embodiment 34 is the method of embodiment 33, wherein the non-ferroelectric polymer is thermoplastic polymer. Embodiment 35 is the method of embodiment 34, wherein the thermoplastic polymer is a poly(p-phenylene oxide), a poly(methyl methacrylate), or a polystyrene. Embodiment 36 is the method of any one of embodiments 1 to 35, wherein the polymeric ferroelectric precursor material can include a ferroelectric polymer and an inorganic material. Embodiment 37 is the method of any one of embodiments 1 to 36, further including subjecting the polymeric ferroelectric precursor material to an electric field. Embodiment 38 is the method of embodiment 37, wherein the polymeric ferroelectric precursor material is subjected to pulsed electromagnetic radiation prior to or simultaneously with the electric field.

Embodiment 38 is a ferroelectric capacitor or thin film transistor that can include the ferroelectric material having ferroelectric hysteresis properties produced from the method of any one of embodiments 1 to 38, wherein the ferroelectric capacitor or thin film transistor includes a first conductive material and a second conductive material, wherein at least a portion of the ferroelectric material is disposed between at least a portion of the first conductive material and at least a portion of the second conductive material. Embodiment 40 is the ferroelectric capacitor or thin film transistor of embodiment 39, wherein the first or second conductive material, or both, each individually includes a metal. Embodiment 41 is the ferroelectric capacitor or thin film transistor of embodiment 40, wherein the metal is platinum, gold, aluminum, silver, or copper, a metal oxide, or any combination or alloy thereof. Embodiment 42 is the ferroelectric capacitor or thin film transistor of any one of embodiments 39 to 41, wherein first or second conductive material, or both, each individually can include PEDOT:PSS or polyaniline. Embodiment 43 is the ferroelectric capacitor or thin film transistor of any one of embodiments 39 to 42, wherein the first or second conductive material, or both, each individually can include indium-doped tin oxide (ITO) or graphene. Embodiment 44 is the ferroelectric capacitor or thin film transistor of any one of embodiments 39 to 43, wherein the ferroelectric capacitor or thin film transistor can be included on a substrate. Embodiment 45 is the ferroelectric capacitor of embodiment 44, wherein the substrate can include silicon, plastic, or paper.

Embodiment 46 is a printed circuit board that can include the ferroelectric material produced by the method of any one of embodiments 1 to 38 or the ferroelectric capacitor or thin film transistor of any one of embodiments 39 to 45. Embodiment 47 is the printed circuit board of embodiment 46, wherein the ferroelectric material or the ferroelectric capacitor or thin film transistor is included in at least a portion of a communications circuit, a sensing circuit, or a control circuit.

Embodiment 48 is an integrated circuit that can include the ferroelectric material produced by the method of any one of embodiments 1 to 38 or the ferroelectric capacitor or thin film transistor of any one of embodiments 39 to 45. Embodiment 49 is the integrated circuit of embodiment 48, wherein the ferroelectric material or the ferroelectric capacitor or thin film transistor can be included in at least a portion of a communications circuit, a sensing circuit, or a control circuit.

Embodiment 50 is an electronic device that can include the ferroelectric material produced by the method of any one of embodiments 1 to 38 or the ferroelectric capacitor or thin film transistor of any one of embodiments 39 to 45.

Embodiment 51 is a method for reading and restoring data to a nonvolatile memory cell that can include the ferroelectric capacitor or thin film transistor of any one of embodiments 39 to 45. Such a method can include (a) applying a voltage to the ferroelectric capacitor or thin film transistor; (b) increasing the voltage by a predetermined amount; (c) detecting a charge signal that results from increasing said voltage, wherein a charge signal having at least a certain minimum amplitude indicates a change in a previously set polarization state representing a first binary logic level; and (d) restoring said previously set polarization state in said ferroelectric capacitor or thin film transistor if the polarization state has been changed, by altering a polarity of the voltage applied to said ferroelectric capacitor or thin film transistor.

Embodiment 52 is a method for writing to a nonvolatile memory cell that can include the ferroelectric capacitor or thin film transistor of any one of embodiments 39 to 45. Such a method can include: (a) applying a voltage to the ferroelectric capacitor or thin film transistor; (b) increasing said voltage by a predetermined amount; (c) detecting a charge signal that results from increasing the voltage, wherein a charge signal having at least a certain minimum amplitude indicates a change to a second polarization state representing a second binary logic level; (d) maintaining said second polarization state if said memory cell represents said second binary logic level; and (e) restoring to a first polarization state representing a first binary logic level if memory cell represents a first binary logic level, by altering a polarity the voltage applied to said ferroelectric capacitor or thin film transistor.

Embodiment 53 is a method of decoupling a circuit from a power supply with any one of the ferroelectric capacitors or thin film transistors of embodiments 39 to 45, the method can include disposing the ferroelectric capacitor or thin film transistor between a power voltage line and a ground voltage line, wherein the ferroelectric capacitor or thin film transistor is coupled to the power voltage line and to the ground voltage line, and wherein a reduction in power noise generated by the power voltage and the ground voltage is achieved.

Embodiment 54 is a method for operating an energy storage circuit that can include any one of the ferroelectric capacitors or thin film transistors of embodiments 39 to 45 which provides electrical power to a consuming device when electrical power from a primary source is unavailable, said method includes (a) defining a target energy level for the ferroelectric capacitor or thin film transistor; (b) charging the ferroelectric capacitor or thin film transistor; (c) measuring a first amount of energy that is stored in the ferroelectric capacitor or thin film transistor during charging; (d) terminating charging of the ferroelectric capacitor or thin film transistor when the first amount of energy stored in the capacitor or thin film transistor reaches the target energy level; and (e) discharging the capacitor or thin film transistor into the consuming device when electrical power from the primary source becomes unavailable.

Embodiment 55 is a method for operating a piezoelectric sensor, a piezoelectric transducer, and a piezoelectric actuator using any one of the ferroelectric capacitors or thin film transistors of embodiments 39 to 45.

The phrase "thermal treatment" refers to heat treatments in which ferroelectric precursor material is subjected to an external heat source such as hot plates, ovens, furnaces, or heat lamps, etc.

The phrase "polymer blend" includes at least two polymers that have been blended together by any of the known techniques for producing polymer blends. Such techniques include solution blending using a common solvent or melt blend extrusion whereby the components are blended at temperatures above the melting point of the polymers and the obtained mixture is subsequently extruded into granules or directly into sheets or any other suitable form. Screw extruders or mills are commonly used for melt blending polymers. It will also be appreciated the blend of polymers may be a simple powder blend providing that the blend is subjected to a homogenizing process before or during the process of fabricating the ferroelectric material of the present invention. Thus, for example, where a ferroelectric material is formed from at least two polymers in a screw-fed injection-molding machine, the feed to the hopper of the screw may be a simple mixture of the two polymers since a blend may be achieved in the screw portion of the machine.

The term "polymer" includes oligomers (e.g., a polymer having 2 to 10 monomeric units or 2 to 5 monomeric units) and polymers (e.g., a polymer having greater than 10 monomeric units). The polymer can be a homopolymer, a copolymer, a terpolymer, or a higher multi-monomer composition, or blends thereof.

The term "about" or "approximately" are defined as being close to as understood by one of ordinary skill in the art, and in one non-limiting embodiment the terms are defined to be within 10%, preferably within 5%, more preferably within 1%, and most preferably within 0.5%.

The use of the word "a" or "an" when used in conjunction with the term "comprising" in the claims or the specification may mean "one," but it is also consistent with the meaning of "one or more," "at least one," and "one or more than one."

The words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "coupled" is defined as connected, although not necessarily directly, and not necessarily mechanically.

The processes of the present invention can "comprise," "consist essentially of," or "consist of" particular steps disclosed throughout the specification. With respect to the transitional phase "consisting essentially of," in one non-limiting aspect, a basic and novel characteristic of the processes of the present invention is that pre-treatment of the ferroelectric precursor material through traditional annealing methods (e.g., heating via oven or heating plates) are not required to obtain ferroelectric material having ferroelectric hysteresis properties. Rather, the pulsed electromagnetic radiation is the only annealing step needed to obtain said ferroelectric hysteresis properties, and said properties can be obtained in microseconds to up to 60 seconds—a prolonged heating step is not required in the context of the present invention.

Other objects, features and advantages of the present invention will become apparent from the following figures, detailed description, and examples. It should be understood, however, that the figures, detailed description, and examples, while indicating specific embodiments of the invention, are given by way of illustration only and are not meant to be limiting. Additionally, it is contemplated that changes and modifications within the spirit and scope of the invention will become apparent to those skilled in the art from this detailed description.

DETAILED DESCRIPTION OF THE INVENTION

The current processes used to make ferroelectric capacitors and thin film transistors from precursor materials require thermal treatment steps that take multiple minutes to hours to sufficiently anneal the precursor material so as to obtain a crystalline phase. While the current processes work, the additional time and energy required to sufficiently anneal the ferroelectric precursor material becomes costly and complicates the production of the ferroelectric capacitors and thin film transistors.

The present invention overcomes the current difficulties associated with the annealing step. In particular, the processes of the present invention can perform the needed annealing step in microseconds rather than the prolonged minutes and hours that are currently needed. Traditional ovens and hot plates are not required for the annealing step. Rather, all that is needed is pulsed electromagnetic radiation for short periods of time. Surprising, the precursor material transforms into ferroelectric material having the desired ferroelectric hysteresis properties within seconds or microseconds. By reducing the time needed to complete the annealing step, the processes of the present invention can be incorporated into more efficient production systems, one of which is a roll-to-roll system.

These and other non-limiting aspects of the present invention are discussed in further detail in the following sections.

A. Ferroelectric Capacitors and Thin Film Transistors

Figure 1:
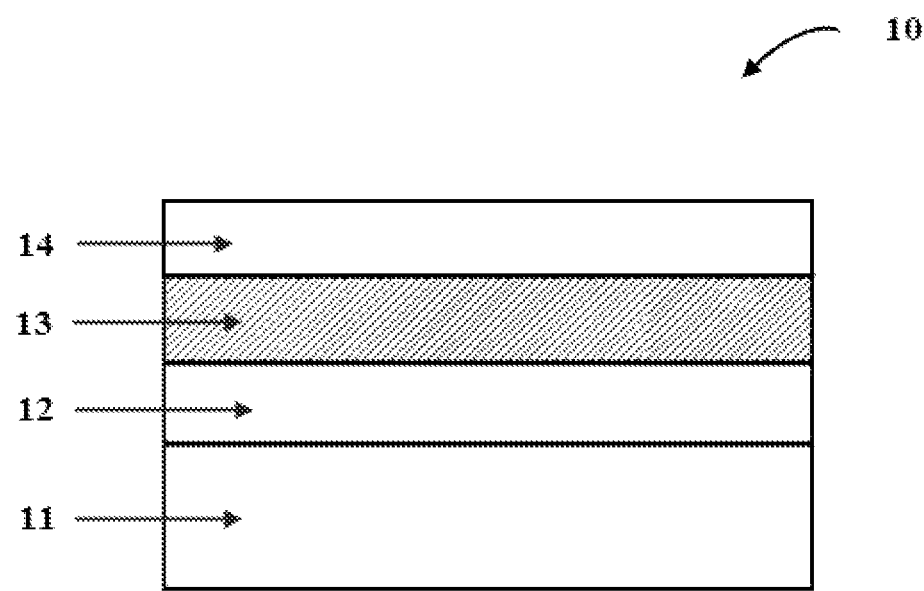
FIG. 1: Illustration of a ferroelectric capacitor that can be made by the processes of the present invention.
Figures 2A, 2B, 2C, 2D:
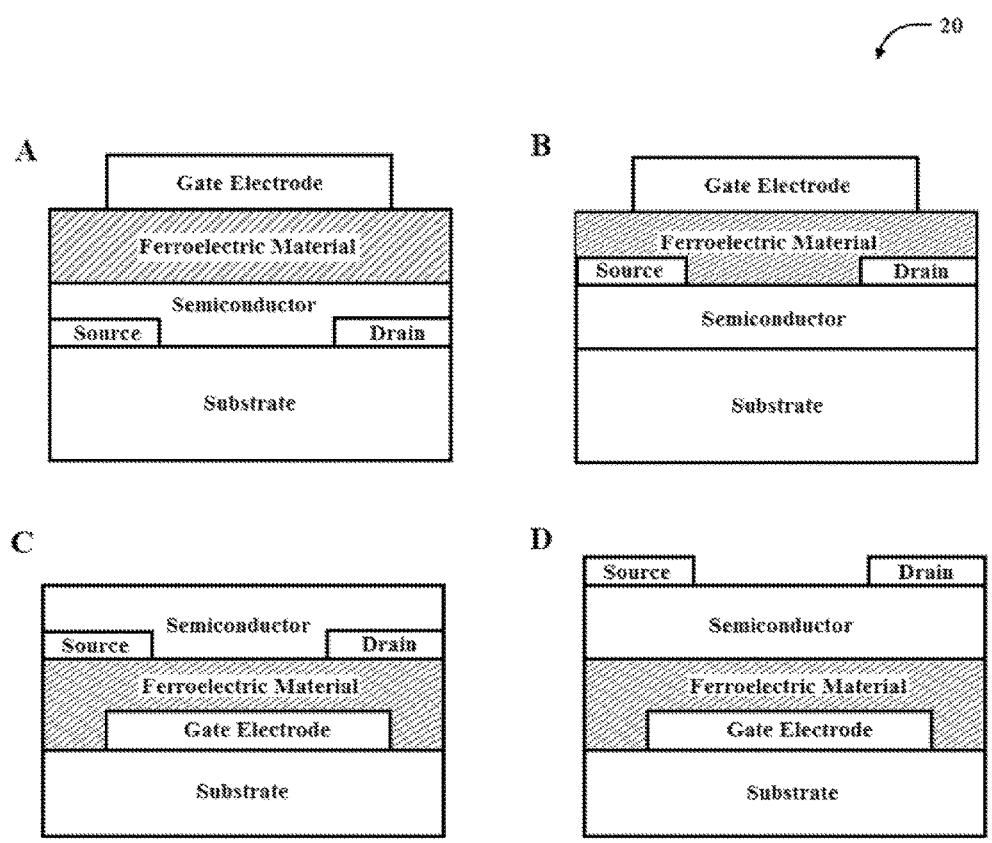
FIGS. 2A-2D: Illustrations of various ferroelectric thin film transistors that can be made by the processes of the present invention.

FIGS. 1 and 2 each provide a cross-sectional view of a ferroelectric capacitor and thin film transistors (field effect transistors with varying set-ups in (A), (B), (C), and (D)), respectively, that can be produced with the processes of the present invention. Before discussing the processes of the present invention, a description of some of the components that can be used to make ferroelectric capacitors and thin film transistors is provided. With reference to FIG. 1, the ferroelectric capacitor (10) includes a ferroelectric material (13) that is annealed with pulsed light. The shading used for the ferroelectric material (13) refers to precursor material that has been transformed into ferroelectric material having hysteresis properties via pulsed electromagnetic radiation—no prior annealing step such as heating via ovens or hot plates is needed. For the purposes of FIG. 1, the ferroelectric material (13) is illustrated in the form of a film or layer. The ferroelectric capacitor (10) can include a substrate (11), a lower electrode (12), a ferroelectric material (13), and an end electrode (14). The ferroelectric capacitor (10) can be fabricated on substrates by sandwiching a ferroelectric material (13) between two conducting electrodes (12) and (14). Additional materials, layers, and coatings (not shown) known to those of ordinary skill in the art can be used with the ferroelectric capacitor (10), some of which are described below. By comparison, FIGS. 2A-2D represent various thin film transistors (20) that can be processed with the methods of the present invention.

The ferroelectric capacitor in FIG. 1 and thin film transistors in FIG. 2 are said to have "memory" because, at zero volts, they have two polarization states that do not decay back to zero. These polarization states can be used to represent a stored value, such as binary 0 or 1, and are read by applying an electric field. The amount of charge needed to flip the polarization state to the opposite state can be measured and the previous polarization state is revealed. This means that the read operation changes the polarization state, and can be followed by a corresponding write operation, in order to write back the stored value by again altering the polarization state.

1. Substrate (10)

The substrate (10) is used as support. It is typically made from material that is not easily altered or degraded by heat or organic solvents. Non-limiting examples of such materials include inorganic materials such as silicon, plastic, paper, banknotes as well as SABIC substrates including polyethylene terephthalate, polycarbonates, poly(methyl methacrylates), or polyetherimides, or polymeric blends can include such polymers. Notably, the annealing step of the present invention is performed in a short period of time (e.g., microseconds to up to 60 seconds—longer processing times can also be used), when compared with presently available annealing techniques such as ovens or hot plates, such that the underlying substrate is not subjected to heat over prolonged periods of time. This feature of the present invention allows for the use of all types of substrates, including those that have low glass transition temperatures ($T_g$) (e.g., polyethylene terephthalate (PET), polyethylene (PE), polyvinyl chloride (PVC), polystyrene (PS), or polypropylene (PP).

2. Lower Electrode and Upper Electrodes (12) and (14)

Staying with FIG. 1, the lower electrode (12) can be is made of a conductive material. Typically, the lower electrode (12) can be obtained by forming a film using such a material (e.g., vacuum deposition, sputtering, ion-plating, plating, coating, etc.). Non-limiting examples of conductive material that can be used to form a film include gold, platinum, silver, aluminum and copper, iridium, iridium oxide, and the like. In addition, non-limiting examples of conductive polymer materials include conducting polymers (such as PEDOT: PSS, Polyaniline, graphene etc.), and polymers made conductive by inclusion of conductive micro- or nano-structures (such as silver nanowires). The thickness of the film for the lower electrode (12) is typically between 20 nm to 500 nm, although other sizes and ranges are contemplated for use in the context of the present invention.

The upper electrode (14) can be disposed on the ferroelectric material (13) by thermally evaporating through a shadow mask. The material used for the upper electrode (14) can be conductive. Non-limiting examples of such materials include metals, metal oxides, and conductive polymers (e.g., polyaniline, polythiophene, etc.) and polymers made conductive by inclusion of conductive micro- or nano-structures such as those discussed above in the context of the lower electrode (12). The upper electrode (14) can be a single layer or laminated layers formed of materials each having a different work function. Further, it may be an alloy of one or more of the materials having a low work function and at least one selected from the group consisting of gold, silver, platinum, copper, manganese, titanium, cobalt, nickel, tungsten, and tin. Examples of the alloy include a lithium-aluminum alloy, a lithium-magnesium alloy, a lithium-indium alloy, a magnesium-silver alloy, a magnesium-indium alloy, a magnesium-aluminum alloy, an indium-silver alloy, and a calcium-aluminum alloy. The film thickness of the upper electrode (14) is typically between 20 nm to 500 nm, although other sizes and ranges are contemplated for use in the context of the present invention.

3. Ferroelectric Material (13)

Continuing with FIG. 1, the ferroelectric material (13) can be interposed between the lower electrode (12) and the upper electrode (14). In one instance, the material (13) can be obtained from a ferroelectric precursor material (see FIG. 3, element (34)), which can include a ferroelectric polymer, copolymer, terpolymer, or a polymer blend that includes a ferroelectric polymer, copolymer, or terpolymer or combinations thereof. In preferred aspects, the polymers in the precursor material (34) are solubilized in a solvent or melt such that they do not exhibit ferroelectric hysteresis properties but can be transformed via pulsed electromagnetic radiation to exhibit ferroelectric hysteresis properties within a matter of second or microseconds. A discussion on this process is provided below. Non-limiting examples of ferroelectric polymers include polyvinylidene fluoride (PVDF)-based polymers, polyundecanoamide (Nylon 11)-based polymers, or blends of PVDF-based polymers or polyundecanoamide (Nylon 11)-based polymers. The PVDF-based polymer can be a homopolymer, a copolymer, or a terpolymer, or a blend thereof. A non-limiting example of a PVDF-based homopolymer polymer is PVDF. Non-limiting examples of PVDF-based copolymers are poly(vinylidene fluoride-tetrafluoroethylene) (P(VDF-TrFE)), poly(vinylidene-fluoride-co-hexafluoropropene) (P(VDF-HFP)), poly(vinylidene-fluoride-chlorotrifluoroethylene) (P(VDF-CTFE)) or poly(vinylidene-fluoride-chlorofluoroethylene) (P(VDF-CFE)). Non-limiting examples of PVDF-based terpolymers include poly(vinylidene-fluoride-trifluoroethylene-chlorotrifluoroethylene) (P(VDF-TrFE-CTFE)) or poly(vinylidene-fluoride-trifluoroethylene-chlorofluoroethylene) (P(VDF-TrFE-CFE)). The ferroelectric polymer can be blended with a non-ferroelectric polymer. Examples of non-ferroelectric polymers include a poly(phenylene oxide) (PPO), a polystyrene (PS), or a poly(methyl methacrylate) (PMMA), or blends thereof. In preferred instances, steps (a) and (b) are performed in a roll-to-roll process.

Figure 3:
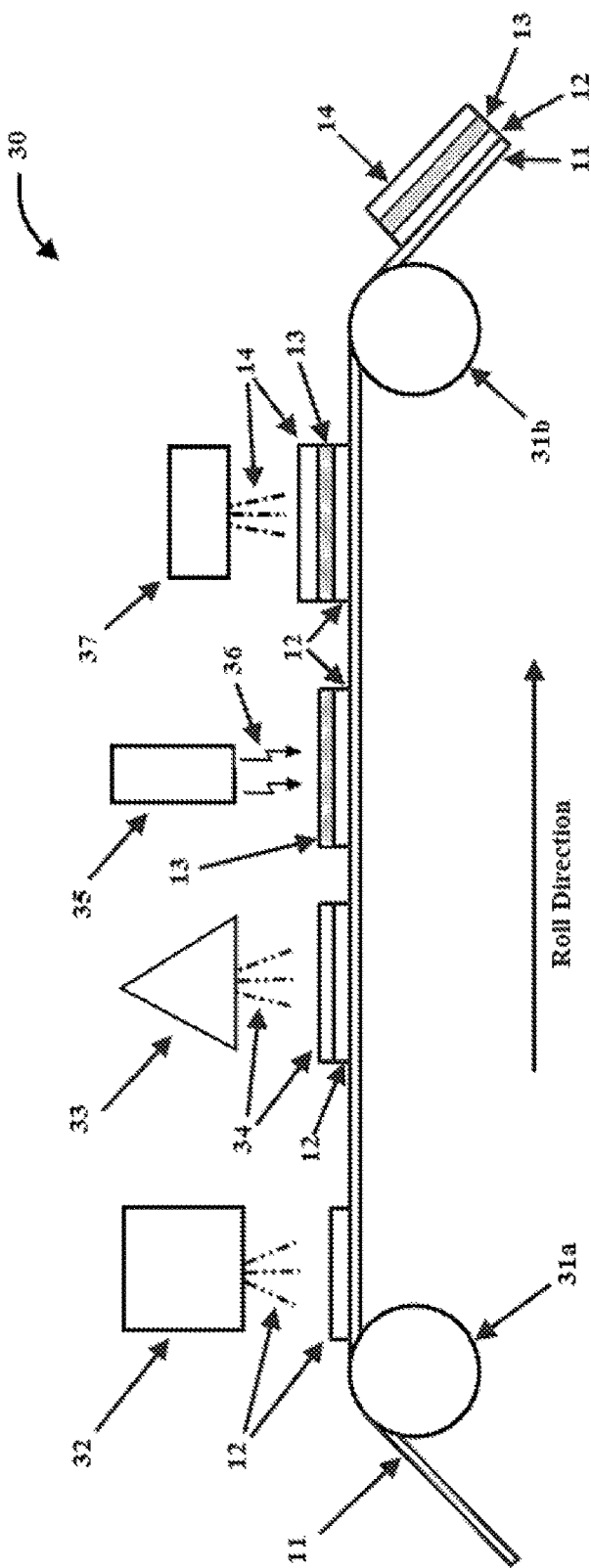
FIG. 3: Illustration of a roll-to-roll process that can be used to make ferroelectric materials, capacitors, thin film transistors, etc., of the present invention.

Referring to FIG. 3, the ferroelectric precursor material (34) can be deposited by obtaining a solution or melt that includes a solvent and the ferroelectric polymer(s) solubilized therein. In certain instances, and after deposition but prior to being subjected to pulsed electromagnetic radiation, the deposited material (34) can slightly or substantially dry (e.g., solvent can begin the evaporation process) to create a semi-dry form. The solution or melt can be prepared in a common solvent which dissolves the polymers or melts the polymers into a blend. Non-limiting examples of such solvents include methyl ethyl ketone, di-methylformamide, acetone, di-methyl sulfoxide, cyclohexanone, tetrahydrofuran, diethyl carbonate, propylene glycol methyl ether acetate, etc. The solution can be deposited by spray coating, ultra sonic spray coating, roll-to-roll coating, ink-jet printing, screen printing, drop casting, spin coating, dip coating, Mayer rod coating, gravure coating, slot die coating, doctor blade coating, extrusion coating, flexography, gravure, offset, rotary screen, flat screen, ink-jet, roll-to-roll photolithography, or laser ablation. Alternatively, and as explained above, other processes such as melt blend extrusion can be used. FIG. 3. provides a non-limiting roll-to-roll system (30) that can be used in the context of the present invention.

B. Roll-to-Roll Process for Producing Ferroelectric Capacitors and Thin Film Transistors Staying with FIG. 3, the roll-to-roll system (30) includes rollers (31a and 31b) that can be used to roll a substrate (11) material at a desired speed. The substrate (11) can be unrolled and placed on a first roller (31a) and then attached to a second roller 31(b) such that the substrate (11) moves from the first roller (31a) to the second roller (31b). Along the path, the system (30) can include various apparatuses for deposition of various materials. For instance, a back electrode (12) can be disposed onto the substrate (11) via any forms of deposition methods discussed above-deposition device is illustrated as (32). If needed, the back electrode (12) can be further processed (e.g., curing of the deposited back electrode (12). After the back electrode (12) is deposited and processed onto the substrate (11), the precursor material (34) can be disposed onto at least a portion of the electrode surface (12) or the substrate (11) or both. In FIG. 3, the precursor material (34) is deposited on the electrode surface (12) via deposition device (33). Notably, the ferroelectric precursor material (34) can then be annealed without the use of an oven or hot plates or other traditional heating sources. Rather, the substrate (11)/back electrode (12)/ferroelectric precursor material (34) stack can be directly rolled to a device (35) that produces pulsed electromagnetic radiation (36) such as the UVH 22024-0 by Ushio America Inc. (Cypress, Calif.), the Lighthammer 10 by Fusion UV Inc. (Gaithersburg, Md.), the BR 70sv by Comec Italia Srl (Italy), standard rapid thermal annealing ovens, or the Pulse-Forge 3200 X2 by Novacentrix® (Austin, Tex.). In preferred non-limiting aspects, the PulseForge 3200 X2, which is designed for roll-to-roll and conveyor-based material processing, can be used. Other PulseForge devices that can be used include model numbers 1200 and 1300. The Pulse-Forge devices can be used in combination with SimPulse™ software (also offered by Novacentrix®) to specifically control the types of electromagnetic radiation, the pulse length of time of each pulse, the frequency of the pulses, the power of the pulses, the heat penetration depth of the pulses to allow for selective heating of the ferroelectric precursor material (34) without heating or significantly heating the underlying substrate (11) or back electrode (12) or both, etc. Some of the specifications for these PulseForge devices include radiant energy delivered (e.g., up to 21 J/cm$^2$), linear processing speed (e.g., up to 30 meters/minute), radiant power delivered (e.g., up to 4.3 KW/cm$^2$), curing dimension per pulse (e.g., up to 75×150 mm), area cured per sample (e.g., 300×150 mm), pulse length range 25 to 10,000 microseconds), pulse length increments (e.g., up to 1 microsecond), pulse spacing (e.g., minimum spacing of 20 microseconds), pulse rate/frequency, electromagnetic output spectrum (200 to 1500 nm), uniformity of exposure (e.g., +/−5% point to point or better). Still another device that can be used for subjecting the ferroelectric precursor material (34) to pulsed electromagnetic radiation includes the Sinteron 5000 device from Xenon Corp. (Wilmington, Mass.), which can also be used in a roll-to-roll system. U.S. Pat. No. 8,410,712, which is incorporated by reference, includes additional information on pulsed electromagnet radiation devices. The pulsed magnetic radiation converts the precursor material (34) into the ferroelectric material having ferroelectric hysteresis properties (13), which is illustrated by the shaded area in (13) when compared with the unshaded lines in (34). It is believed that the pulsed magnetic radiation (36) allows for the formulation of a crystalline phase (shaded portion in (13)) via chemical restricting of the precursor material (34) or removal of the solvent from said precursor material (34), or both. Subsequently, the substrate (11)/back electrode (12)/ferroelectric material (13) stack can be further processed by deposing a front electrode (14) onto at least a surface of the ferroelectric material (13) via a deposition device 37. The front electrode (14), if needed, can be further cured.

The process of the present invention can efficiently produce high-performance ferroelectric capacitors (10) or thin film transistors (2) in large-scale quantities in a quick and cost efficient manner. Notably, however, the annealing step of the present invention does not have to be limited to use in a roll-to-roll system. Rather, and as illustrated in the Examples, claims, and the summary of the present invention, the key processing step is the pulsed electromagnetic radiation, which can be used in all types of thin film transistor or capacitor manufacturing processes.

C. Applications for Ferroelectric Capacitors and Thin Film Transistors

Any one of the ferroelectric capacitors or thin film transistors of the present invention can be used in a wide array of technologies and devices including but not limited to: smartcards, RFID cards/tags, piezoelectric sensors, piezoelectric transducers, piezoelectric actuators, pyroelectric sensors, memory devices, non-volatile memory, standalone memory, firmware, microcontrollers, gyroscopes, acoustics sensors, actuators, microgenerators, power supply circuits, circuit coupling and decoupling, RF filtering, delay circuits, and RF tuners. If implemented in memory, including firmware, functions may be stored in the ferroelectric capacitors or thin film transistors as one or more instructions or code on a computer-readable medium. Examples include computer-readable media encoded with a data structure and computer-readable media encoded with a computer program. Computer-readable media includes physical computer storage media. Combinations of the above should also be included within the scope of computer-readable media.

In many of these applications thin films of ferroelectric materials are typically used, as this allows the field required to switch the polarization to be achieved with a moderate voltage. Although some specific circuitry has been set forth, it will be appreciated by those skilled in the art that not all of the disclosed circuitry is required to practice the disclosure. Moreover, certain well known circuits have not been described, to maintain focus on the disclosure.

Figure 4:
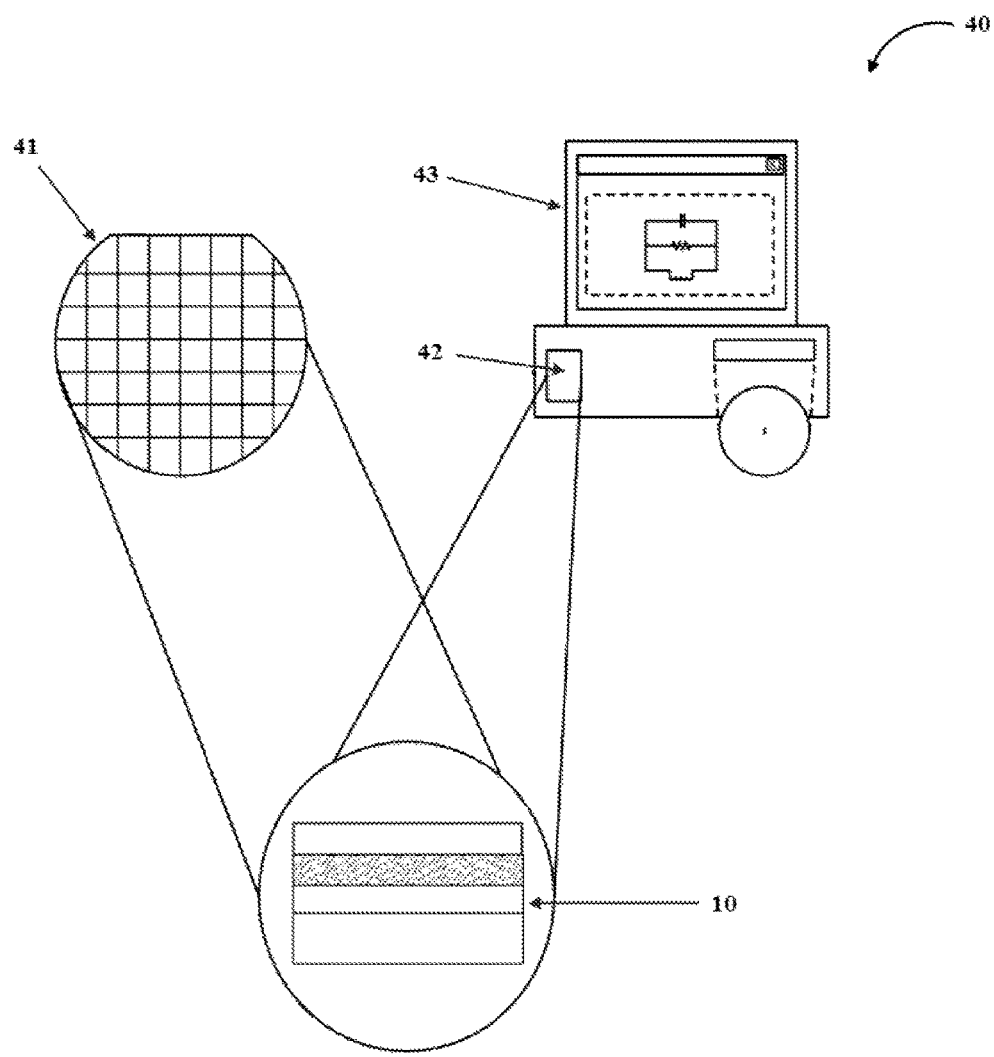
FIG. 4: Block diagram illustrating implementation of a circuit in a semiconductor wafer or an electronic device using ferroelectric capacitors and thin film transistors of the present invention.

FIG. 4 is block diagram illustrating implementation of an integrated circuit in a semiconductor wafer or an electronic device according to one embodiment. In one case, a ferroelectric capacitor (10) or thin film transistor (20) may be found in a wafer (41). Due to spatial restrictions, FIG. 4 references a ferroelectric capacitor (10). However, it should be recognized, that the thin film transistor (20) can replace the ferroelectric capacitor (10) or can be included/utilized along with said ferroelectric capacitor (10) in the electronic device illustrated in FIG. 4. The wafer (41) may be singulated into one or more dies that may contain the ferroelectric capacitor (10) or thin film transistor (20). Additionally, the wafer (41) may experience further semiconductor manufacturing before singulation. For example, the wafer (41) may be bonded to a carrier wafer, a packaging bulk region, a second wafer, or transferred to another fabrication facility. Alternatively, an electronic device (43) such as, for example, a personal computer, may include a memory device (42) that can include the ferroelectric capacitor (10) or thin film transistor (20). Additionally, other parts of the electronic device (43) may include the ferroelectric capacitor (10) or thin film transistor (20) such as a central processing unit (CPU), a digital-to-analog converter (DAC), an analog-to-digital converter (ADC), a graphics processing unit (GPU), a microcontroller, or a communications controller.

Figure 5:
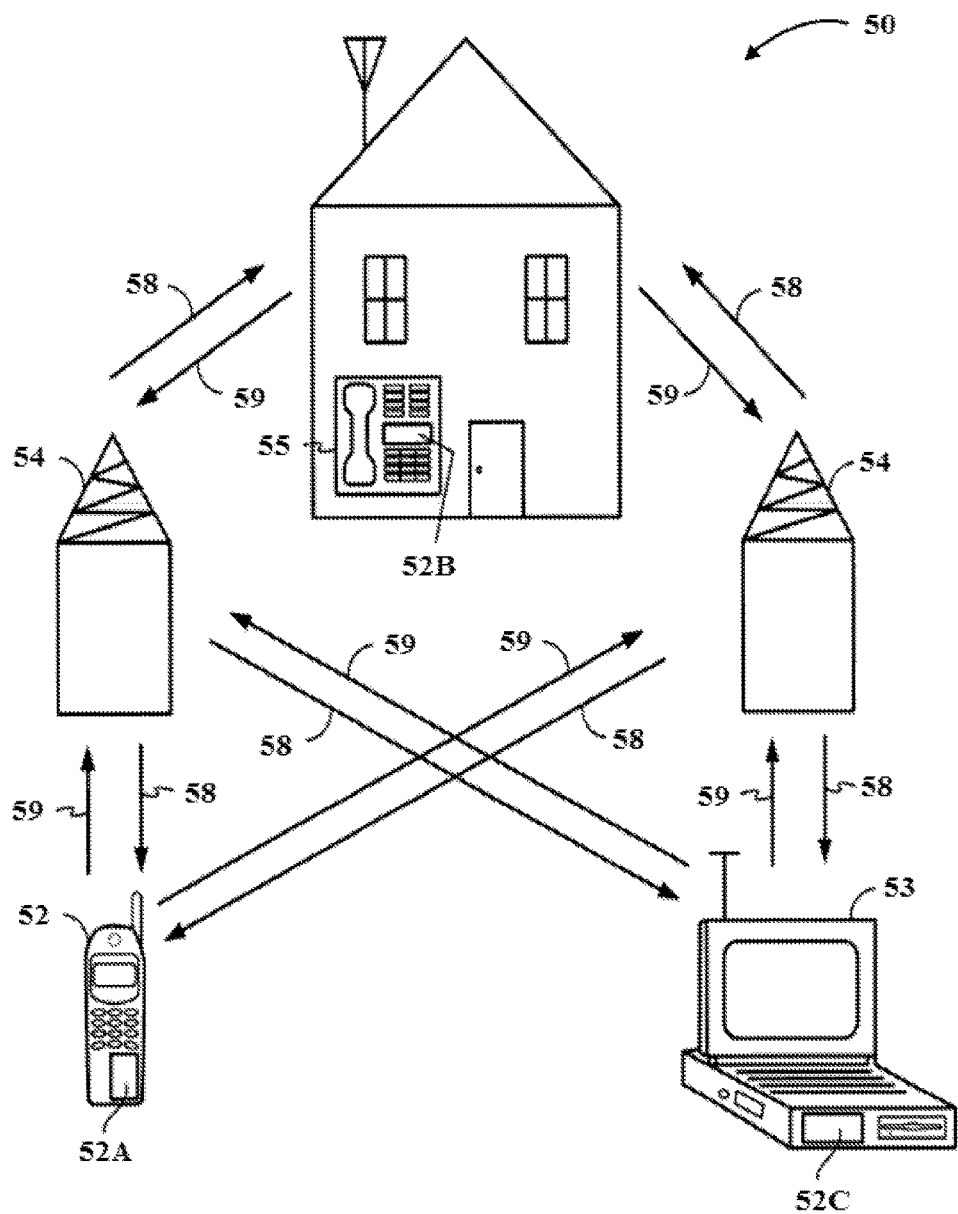
FIG. 5: Block diagram showing an exemplary wireless communication system in which a ferroelectric capacitor or thin film transistor of the present invention may be advantageously employed.

FIG. 5 is a block diagram showing an exemplary wireless communication system (50) in which an embodiment of the disclosure may be advantageously employed. For purposes of illustration, FIG. 5 shows three remote units (52), (53), and (55) and two base stations (54). It will be recognized that wireless communication systems may have many more remote units and base stations. Remote units (52), (53), and (55) include circuit devices (52A), (52C) and (52B), which may include integrated circuits or printable circuit boards, that include the disclosed ferroelectric capacitor or thin film transistors made by the processes of the present invention. It will be recognized that any device containing an integrated circuit or printable circuit board may also include the ferroelectric capacitor or thin film transistor disclosed herein, including the base stations, switching devices, and network equipment. FIG. 5 shows forward link signals (58) from the base station (54) to the remote units (52), (53), and (55) and reverse link signals (59) from the remote units (52), (53), and (55) to base stations (54).

In FIG. 5, remote unit (52) is shown as a mobile telephone, remote unit (53) is shown as a portable computer, and remote unit (55) is shown as a fixed location remote unit in a wireless local loop system. For example, the remote units may be mobile phones, hand-held personal communication systems (PCS) units, portable data units such as personal data assistants, GPS enabled devices, navigation devices, set upper boxes, music players, video players, entertainment units, fixed location data units such as meter reading equipment, or any other device that stores or retrieves data or computer instructions, or any combination thereof. Although FIG. 5 illustrates remote units according to the teachings of the disclosure, the disclosure is not limited to these exemplary illustrated units. Embodiments of the disclosure may be suitably employed in any device which includes the ferroelectric capacitor (10) or thin film capacitor (20) made by the processes disclosed by the present invention.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

EXAMPLES

The present invention will be described in greater detail by way of specific examples. The following examples are offered for illustrative purposes only, and are not intended to limit the invention in any manner. Those of skill in the art will readily recognize a variety of noncritical parameters which can be changed or modified to yield essentially the same results.

Example 1

Preparation of Ferroelectric Precursor Material 5.1 wt. % polyvinylidene fluoride (PVDF) was solubilized in dimethylformamide (DMF) to obtain a solution. The solution was spin-coated (3000 rpm for 60 sec.) onto a platinum-coated silicon wafer to obtain a thin film of approximately 190 nm. The films were spun, stored inside a standard "gel-pak", and exposed to the radiation 6 days later.

Example 2

Processing of the Ferroelectric Precursor Material into Ferroelectric Material Having Ferroelectric Hysteresis Properties Following the casting of the platinum-coated silicon wafer supported PVDF thin film solution, and without any form of heating, the thin film solution was directly exposed to light irradiation from a PulseForge 1300 photonic curing tool, supplied by Novacentrix (Austin, Tex., USA). The following parameters were used via Novacentrix's Simpulse® software, which is used in conjunction with the PulseForge tool:

(1) Pulse radiant energy approximately 2-4 $J/cm^2$.
(2) Pulse Depth approximately 200 nm.
(3) Output Light Spectrum 200 to 1000 nm.
(4) Pulse Length: None; Short (about 200 µs), Medium (about 400 µs), and Long (about 800 µs).
(5) Pulse Frequency: Adjusted by the Simpulse® software from a single pulse to 1 Hz to maintain the pulse temperature and pulse length delivered to the PVDF thin film solution.

Figure 6:
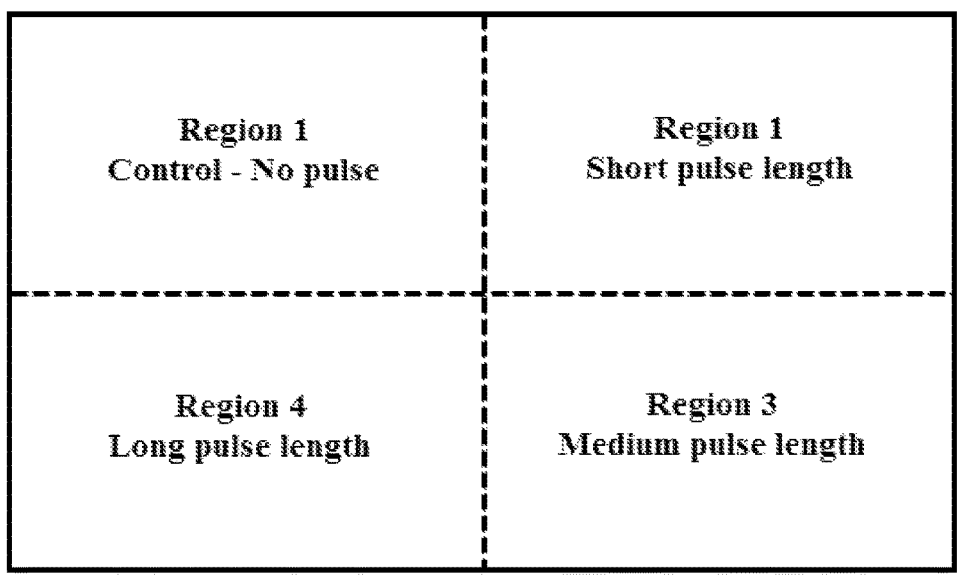
FIG. 6: Schematic of PVDF thin film used for testing. Using a steel mask, sample was divided into 4 regions to investigate the effect of pulse length on ferroelectric performance.

For comparative data, the test was conducted such that, using a steel mask, only selected regions of the platinum-coated silicon wafer supported PVDF thin film solution were exposed to pulsed light, each using a different pulse length (none, short, medium, long). FIG. 6 provides a schematic illustrating this set up.

Example 3

Ferroelectric Hysteresis Properties of Produced Ferroelectric Material

Figure 7:
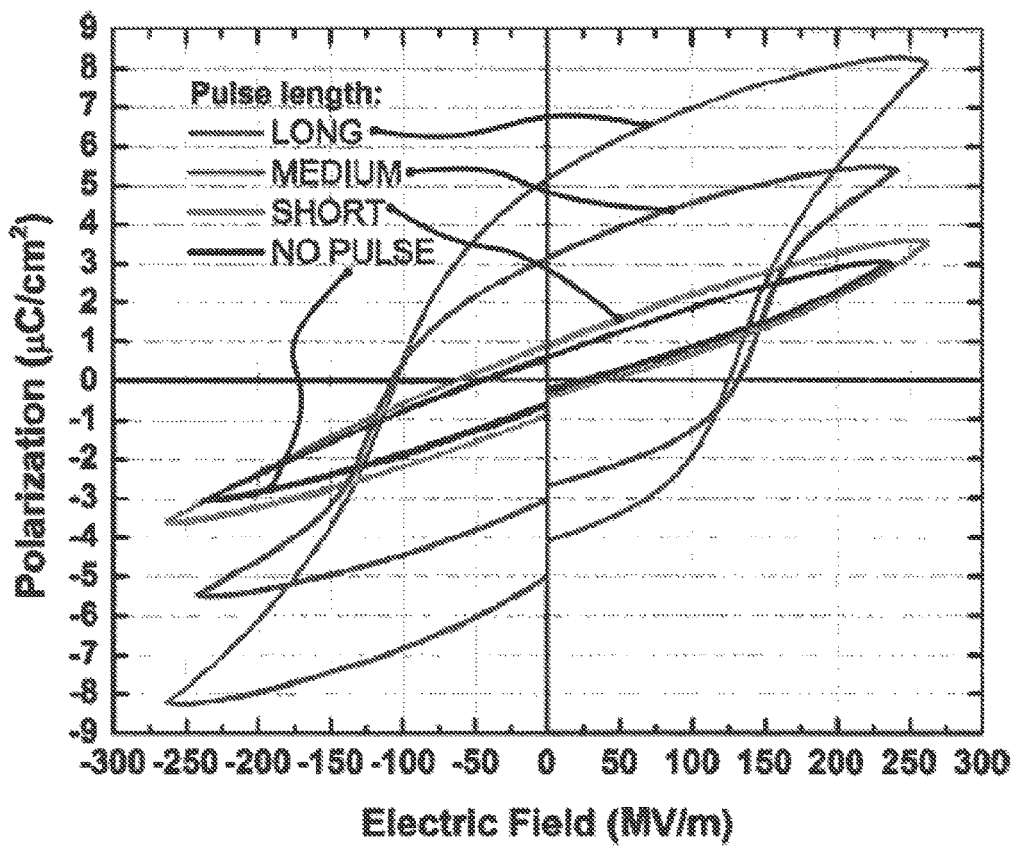
FIG. 7: Polarization hysteresis of PVDF film (~190 nm) exposed to photon irradiation at ~190° C. using no pulse, short pulse length, medium pulse length, and long pulse length. The no pulse experiment was not exposed to any irradiation.

Following photonic exposure using the PulseForge tool, Au electrodes were evaporated using a shadow mask to cover the entire top surface of the film for ferroelectric characterization. FIG. 7 provides the results of these tests. In particular, at least 4 devices from each region were tested. As evident in FIG. 7, the best ferroelectric hysteresis loops were obtained over the sample area exposed to the longest pulse length (Region 4). This area on the sample was specifically able to withstand high fields (>250 MV/m) without showing top electrode explosions typically seen with as-spun samples. The memory device exhibits saturated ferroelectric polarization hysteresis upon electroforming of the device at electric fields of ~250 MV/m, showing a remnant polarization of about 5 $\mu C/cm^2$ and coercive field of about 110 MV/m at 10 Hz. This is in line with the best reported polarization hysteresis loops for PVDF. Medium pulse length (Region 3) also exhibit ferroelectricity, but with lower device yield and a maximum remnant polarization of ~3 $\mu C/cm^2$ at 10 Hz.

By comparison, Regions 1 (no pulse light) and 2 (short pulse length) did not show any ferroelectric behavior. These devices instantly broke down at low frequencies (10 Hz). Therefore, data at 100 Hz instead of 10 Hz is shown in FIG. 7. There was no evidence of polarization even after reaching electric fields sufficient for electroforming (~230 MV/m). The lowest performing devices were under Region 1, the area on the sample that was not exposed to any pulse light.

Figure 8:
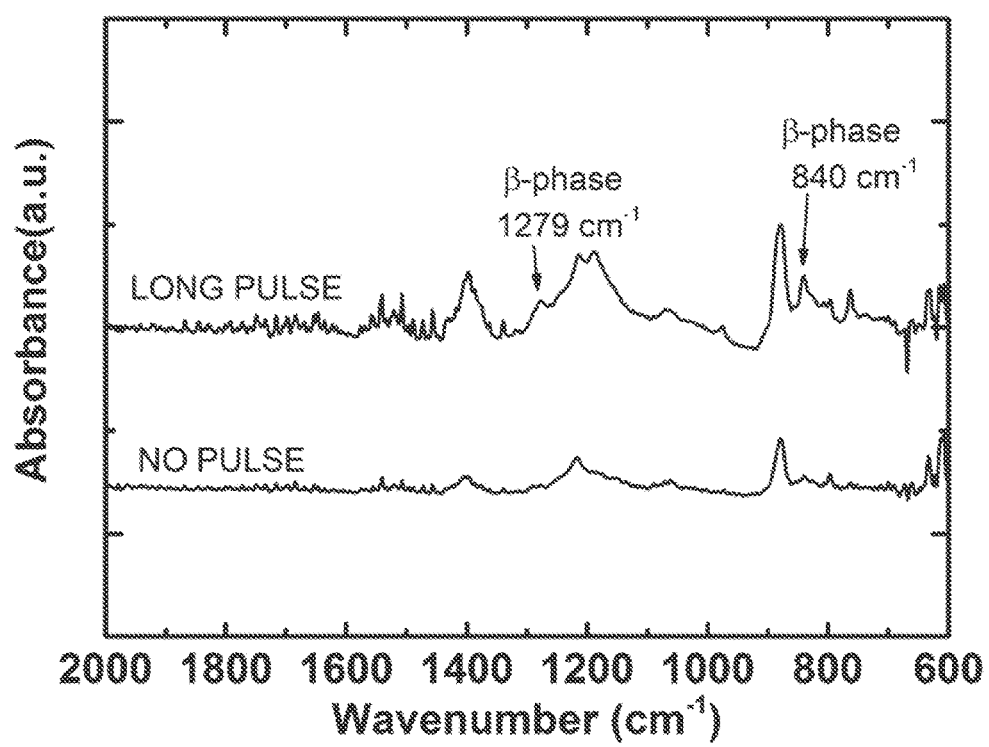
FIG. 8: Graphs of absorbance (a.u.) versus wavenumber ($cm^{-1}$) of non-pulsed and long pulsed (about 800 μs) polymeric ferroelectric precursor material.

Without wishing to be bound by theory, it is believed that the longer photonic exposures permit more time for polymer rearrangement to obtain a crystalline phase for ferroelectric hysteresis properties. Thus, depending on the pulse length and radiant energy of the photons, gradual formation of crystalline alpha-phase in PVDF is formed which can be electroformed into the ferroelectric delta-phase. Additionally, the ferroelectric beta-phase is also formed as shown in FIG. 8.

The invention claimed is:

1. A method for producing a polymeric ferroelectric material, the method comprising the steps of:
   (a) obtaining a polymeric ferroelectric precursor material; and
   (b) subjecting the polymeric ferroelectric precursor material to pulsed ultraviolet radiation sufficient to form the polymeric ferroelectric material having ferroelectric hysteresis properties,
   wherein the polymeric ferroelectric precursor material, prior to step (b), has not previously been subjected to a thermal treatment for more than 55 minutes;
   wherein steps (a) and (b) are performed in a roll-to-roll process, and the method further comprises:
   (i) obtaining a substrate uncoiled from a roll;
   (ii) disposing a back electrode onto at least a portion of a surface of the substrate;
   (iii) disposing the polymeric ferroelectric precursor material onto at least a portion of a surface of the back electrode such that the ferroelectric precursor material comprises a first surface and an opposing second surface that is in contact with the back electrode;
   (iv) subjecting at least a portion of the first surface to pulsed ultraviolet radiation sufficient to form the polymeric ferroelectric material having ferroelectric hysteresis properties, wherein the polymeric ferroelectric precursor material, prior to step (iv), has not previously been subjected to a thermal treatment for more than 55 minutes, more than 30 minutes, more than 5 minutes, or has not previously been subjected to the thermal treatment; and
   (v) disposing a front electrode onto at least a portion of the first surface of the ferroelectric material having the ferroelectric hysteresis properties.

2. The method of claim 1, wherein the pulse length is 25 µs to 10,000 µs.

3. The method of claim 1, wherein step (a) further comprises disposing the polymeric ferroelectric precursor material onto a substrate such that the polymeric ferroelectric precursor material has a first surface and an opposing second surface,
   wherein the second surface is in contact with the substrate surface.

4. The method of claim 1, wherein the polymeric ferroelectric precursor material in step (a) comprises a ferroelectric polymer.

5. The method of claim 4, wherein the ferroelectric polymer is a polyvinylidene fluoride (PVDF)-based polymer or a blend comprising a PVDF-based polymer.

6. The method of claim 5, wherein the PVDF-based polymer is PVDF, a poly(vinylidene fluoride-tetrafluoroethylene) (P(VDF-TrFE)), or a poly(vinylidene-fluoride-co-hexafluoropropene) (P(VDF-HFP)), poly(vinylidene fluoride-co-chlorotrifluoro ethylene) (PVDF-CTFE), poly(vinylidene fluoride-co-chlorofluoroethylene) (PVDF-CFE), poly(vinylidene fluoride-co-chlorodifluoroethylene) (PVDF-CDFE), poly(vinylidene fluoride-co-trifluoroethylene-co-chlorofluoroethylene) (PVDF-TrFE-CFE), poly(vinylidene fluoride-co-trifluoroethylene-co-chlorotrifluoroethylene) (PVDF-TrFE-CTFE), poly(vinylidene fluoride-co-trifluoroethylene-co-hexafluoropropylene) (PVDF-TrFE-HFP), poly(vinylidene fluoride-co-trifluoroethylene-co-chlorodifluoroethylene) (PVDF-TrFE-CDFE), poly (vinylidene fluoride-co-tetrafluoroethylene-co-chlorofluoroethylene) (PVDF-TFE-CFE), poly(vinylidene fluoride-co-tetrafluoroethylene-co-chlorotrifluoroethylene) (PVDF-TFE-CTFE), poly(vinylidene fluoride-co-tetrafluoroethylene-co-hexafluoropropylene) (PVDF-TFE-HFP), and poly(vinylidene fluoride-co-tetrafluoroethylene-co-chlorodifluoroethylene) (PVDF-TFE-CD FE), or a polymeric blend thereof.

7. The method of claim 1, wherein no curing agent is used or contained in the polymeric ferroelectric precursor material in step (a).

8. The method of claim 1, wherein the polymeric ferroelectric precursor material, prior to step (b), has not previously been subjected to a thermal treatment for more than 30 minutes.

9. The method of claim 1, wherein the polymeric ferroelectric precursor material, prior to step (b), has not been subjected to a thermal treatment for more than 5 minutes.

10. The method of claim 1, wherein the polymeric ferroelectric precursor material comprises a ferroelectric polymer and an inorganic material.

11. The method of claim 1, further comprising subjecting the polymeric ferroelectric precursor material to an electric field.

12. A ferroelectric capacitor or thin film transistor comprising the ferroelectric material having ferroelectric hysteresis properties produced from the method of claim 1, wherein the ferroelectric capacitor or thin film transistor includes a first conductive material and a second conductive material, wherein at least a portion of the ferroelectric material is disposed between at least a portion of the first conductive material and at least a portion of the second conductive material.

13. A printed circuit board comprising the ferroelectric material produced by the method of claim 1.

14. An integrated circuit comprising the ferroelectric material produced by the method of claim 1.

15. An electronic device comprising the ferroelectric material produced by the method of claim 1.

16. A method of decoupling a circuit from a power supply with any one of the ferroelectric capacitors or thin film transistors comprising the ferroelectric material having ferroelectric hysteresis properties produced from the method of claim 1, the method comprising disposing the ferroelectric capacitor or thin film transistor between a power voltage line and a ground voltage line, wherein the ferroelectric capacitor or thin film transistor is coupled to the power voltage line and to the ground voltage line, wherein a reduction in power noise generated by the power voltage and the ground voltage is achieved, and wherein the ferroelectric capacitor or thin film transistor includes a first conductive material and a second conductive material, wherein at least a portion of the ferroelectric material is disposed between at least a portion of the first conductive material and at least a portion of the second conductive material.

17. A method for operating an energy storage circuit comprising any one of the ferroelectric capacitors or thin film transistors comprising the polymeric ferroelectric material made by the method of claim 1, which provides electrical power to a consuming device when electrical power from a primary source is unavailable, said method comprising:
(a) defining a target energy level for the ferroelectric capacitor or thin film transistor;
(b) charging the ferroelectric capacitor or thin film transistor;
(c) measuring a first amount of energy that is stored in the ferroelectric capacitor or thin film transistor during charging;
(d) terminating charging of the ferroelectric capacitor or thin film transistor when the first amount of energy stored in the capacitor or thin film transistor reaches the target energy level; and
(e) discharging the capacitor or thin film transistor into the consuming device when electrical power from the primary source becomes unavailable, and
wherein the ferroelectric capacitor or thin film transistor includes a first conductive material and a second conductive material, wherein at least a portion of the ferroelectric material is disposed between at least a portion of the first conductive material and at least a portion of the second conductive material.

18. A method for operating a piezoelectric sensor, a piezoelectric transducer, or a piezoelectric actuator using any one of the ferroelectric capacitors or thin film transistors comprising the ferroelectric material having ferroelectric hysteresis properties produced from the method of claim 1, wherein the ferroelectric capacitor or thin film transistor includes a first conductive material and a second conductive material, wherein at least a portion of the ferroelectric material is disposed between at least a portion of the first conductive material and at least a portion of the second conductive material.

19. A method for reading and restoring data to a nonvolatile memory cell comprising a ferroelectric capacitor or a thin film transistor comprising a polymeric ferroelectric material made by:
(a) obtaining a polymeric ferroelectric precursor material; and
(b) subjecting the polymeric ferroelectric precursor material to pulsed ultraviolet radiation sufficient to form the polymeric ferroelectric material, the polymeric ferroelectric material having ferroelectric hysteresis properties,
wherein the polymeric ferroelectric precursor material, prior to step (b), has not previously been subjected to a thermal treatment for more than 55 minutes,
wherein the ferroelectric capacitor the thin film transistor includes a first conductive material and a second conductive material, and
wherein at least a portion of the polymeric ferroelectric material is disposed between at least a portion of the first conductive material and at least a portion of the second conductive material, the method comprising:
(i) applying a voltage to the ferroelectric capacitor or the thin film transistor;
(ii) increasing the voltage by a predetermined amount;
(iii) detecting a charge signal that results from increasing the voltage, wherein the charge signal having at least a certain minimum amplitude indicates a change in a previously set polarization state representing a first binary logic level; and
(iv) restoring said previously set polarization state in the ferroelectric capacitor or the thin film transistor when the polarization state has been changed, by altering a polarity of the voltage applied to the ferroelectric capacitor or the thin film transistor.

20. A method for writing to a nonvolatile memory cell comprising a ferroelectric capacitor or a thin film transistor comprising a polymeric ferroelectric material made by:
(a) obtaining a polymeric ferroelectric precursor material; and (b) subjecting the polymeric ferroelectric precursor material to pulsed ultraviolet radiation sufficient to form the polymeric ferroelectric material, the polymeric ferroelectric material having ferroelectric hysteresis properties, wherein the polymeric ferroelectric precursor material, prior to step (b), has not previously been subjected to a thermal treatment for more than 55 minutes, wherein the ferroelectric capacitor or the thin film transistor includes a first conductive material and a second conductive material, wherein at least a portion of the polymeric ferroelectric material is disposed between at least a portion of the first conductive material and at least a portion of the second conductive material, the method comprising:

(i) applying a voltage to the ferroelectric capacitor or the thin film transistor;

(ii) increasing said voltage by a predetermined amount;

(iii) detecting a charge signal that results from increasing said voltage, wherein a charge signal having at least a certain minimum amplitude indicates a change to a second polarization state representing a second binary logic level;

(iv) maintaining said second polarization state if said nonvolatile memory cell represents said second binary logic level; and (v) restoring to a first polarization state representing a first binary logic level when the nonvolatile memory cell represents a first binary logic level, by altering a polarity of the voltage applied to the ferroelectric capacitor or the thin film transistor.

* * * * *